United States Patent [19]

Ohikata et al.

[11] Patent Number: 5,153,708
[45] Date of Patent: Oct. 6, 1992

[54] TAPE CARRIER USED IN TAB SYSTEM

[75] Inventors: Naoharu Ohikata; Tadashi Kamiyama, both of Tokyo; Michio Osada, Uji, all of Japan

[73] Assignees: Nippon Steel Corporation; Towa Corporation, Tokyo, Japan

[21] Appl. No.: 757,623

[22] Filed: Sep. 11, 1991

[30] Foreign Application Priority Data

Sep. 14, 1990 [JP] Japan .................................. 2-245632

[51] Int. Cl.⁵ .......................................... H01L 23/48
[52] U.S. Cl. ...................................... 357/70; 357/72
[58] Field of Search .................................. 357/70, 72

[56] References Cited

FOREIGN PATENT DOCUMENTS 2-188939  7/1990  Japan .

Primary Examiner—Edward J. Wojciechowicz
Attorney, Agent, or Firm—Pollock, Vande Sande & Priddy

[57] ABSTRACT

A tape carrier used for assemblage of integrated circuit chips based on a TAB system, comprises a plurality of square frames, each including a substantially square opening for defining a position of an integrated circuit chip to be bonded to the frame, the square opening being formed within a mold area of the frame on which, when the integrated circuit chip mounted at the square opening and bonded to the frame is resin-molded, the resin-molded integrated circuit chip extends. At least two substantially rectangular first openings are formed within the mold area at a space between the square opening and an outer periphery of the mold area. A plurality of lead groups, extend from an inside of the square opening to positions adjacent to a periphery of the frame by crossing one of the first openings. At least one second opening is formed at a space between adjacent two of the first openings, and such that none of the leads extend across the second opening, thereby allowing a resin to flow therethrough in a process of resin-molding the integrated circuit chip mounted at the square opening.

4 Claims, 3 Drawing Sheets

TAPE CARRIER USED IN TAB SYSTEM

BACKGROUND OF THE INVENTION

1. Field of the Invention

The present invention relates to a tape carrier used for assemblage or packaging of integrated circuit chips based on a TAB system.

2. Description of the Related Art

A TAB system is known as one of the techniques for assemblage of integrated circuit chips cut out of a wafer. This method uses a film tape, called a tape carrier, which includes a film made of a synthetic resin such as polyimide. The film tape has a plurality of frames which are consecutively arranged in one line and each of which corresponds to one integrated circuit chip. Each frame of the film tape includes a multiplicity of leads formed into a predetermined pattern for connection of the integrated circuit chip to a printed circuit board. In the TAB system, the leads in each frame of the film tape and pads provided at a bonding or connection portion of the corresponding integrated circuit chip are bonded or connected en bloc.

The TAB system has features that a high-speed automatic face-up bonding is applicable and it is possible to test the bonding condition of each integrated circuit chip as connected to the film tape. Further, since it is possible to accommodate the integrated circuit chip into very small element by resin-molding the chip as bonded to the film tape by the TAB system with resin material such as epoxy resin containing fillers, the TAB system is widely applied to assemblage of the integrated circuit chips used for wrist watch, camera, calculator or the like.

A transfer molding method, as disclosed by Tummala et al on pages 578 to 604 in Microelectronics Packaging Handbook published by Van Nostrand Reinhold Company Ltd. 1989, is widely used as the method of resin-molding a chip. In the transfer molding method, a film tape having a chip mounted thereon is sandwiched between upper and lower die members of a transfer mold die and a heated and molten resin is press-injected into the resin-fill cavity formed between the upper and lower die members and is soldified. In the transfer molding method, if the molten resin is injected into the transfer mold die at a low speed, it is possible in mass production to maintain good quality of the products without causing deterioration in characteristics of wires, chips and so on thereof.

The transfer mold die has only one resin supply pot from which the resin is supplied. This is because if two resin supply pots are respectively provided in the upper and lower die members of the transfer mold die, resins supplied from two directions join to form a seam of resins which may remain after resin-molding. Though only one resin supply pot is thus provided, a film tape existing at an opening of the cavity in which the resin is to be filled divides the supplied resin into two parts, one part which enters the cavity of the upper die member and the other part which enters the cavity of the lower die member.

There are many copper leads on an upper surface of the film tape so as to make the upper surface irregular, whereas there is only a chip having a flat surface on the lower surface of the film tape so that the lower surface is substantially flat. Accordingly, when the resin is injected, the copper leads prevent the resin from smoothly flowing into the cavity of the upper mold die member, while the lower surface provides no substantial obstruction for smooth flow of the resin so that the resin is allowed to smoothly flow into the cavity of the lower mold die member. Therefore, when a conventional film tape is used, the flowing rate of the resin into the cavity of the upper mold die member is substantially different or imbalanced from that of the resin into the cavity of the lower mold die member, resulting in different conditions in solidification of the resin in the cavity between the upper mold die member and the lower mold die member thereby making difficult to obtain uniform resin-molding of the integrated circuit chip.

Also, the conventional film tape involves a problem that when the flowing rate of the resin into the resin fill cavity of the upper mold die member is imbalanced with that of the lower mold die member, the film tape is bent toward one of the upper and lower mold die members into which the flowing rate of the resin is smaller than the other, so that the flatness of the film tape is distorted thereby preventing good resin molding.

As disclosed in, for example, JP-A-2-188939, the conventional tape carrier includes a plurality of square frames each of which has at its central portion a square opening for defining the position of an integrated circuit chip to be bonded. Many leads in each frame are divided into four lead groups and the leads in each lead group extend substantially perpendicularly to one side of the square opening. One end of each lead is positioned inside the square opening and adjacent to the one side of the square opening and the other end thereof is bonded or connected to one of pads provided along the one side of the square frame. Each frame further has a plurality of elongated openings outside a mold area where the integrated circuit chip as bonded is resin-molded, that is, an area which corresponds to the cavity of a transfer mold die in which the resin is to be filled. The resin-molded integrated circuit chip is cut off from the tape carrier along the elongated openings and the leads extending from the sides of the resin-molded integrated circuit chip are connected to a printed circuit board in a subsequent process. In another type of the tape carrier, additional openings are formed in a space between an outer periphery of the mold area and the square opening along the respective sides of the square opening. In this type of the tape carrier, the cavities of the upper and lower die members of a transfer mold die communicate with each other through the additional openings. However, many leads in each lead group extending across the additional opening block the smooth flow of injected resin from one to the other of the cavities of the upper and lower die members.

SUMMARY OF THE INVENTION

An object of the present invention is to provide a tape carrier which is capable of making smooth the flow of a resin injected into the mold die, when an integrated circuit chip as bonded is resin-molded, thereby preventing generation of defects at resin-molding work.

According to the present invention, a tape carrier used for assemblage of integrated circuit chips in a TAB system comprises a plurality of square frames, each of the frames comprising a first square opening for defining a position of an integrated circuit chip to be bonded, a plurality of lead groups, leads of each group extending from an inside of the square opening to positions adjacent to a periphery of the frame and at least one second opening formed between adjacent two of the lead groups in a space between the first opening and an outer periphery of a mold area where the integrated circuit chip after bonded to the frame is to be resin-molded.

In the present invention, when an integrated circuit chip is resin-molded by use of, for example, a transfer mold die, the upper and lower die cavities of the transfer mold die communicate with each other through the second opening where no lead exists. Therefore, even if the flow rates of the resin into the upper and lower die cavities are different from each other, the resin flows through the second opening from one of the cavities into which more resin flows to the other cavity. As a result, the resultant flow rates of the resin into the upper and lower die cavities are balanced, thereby improving the quality of resin-molded chips.

DESCRIPTION OF THE PREFERRED EMBODIMENTS

Embodiments of the present invention will now be explained with reference to the accompanying drawings.

Figure 1:
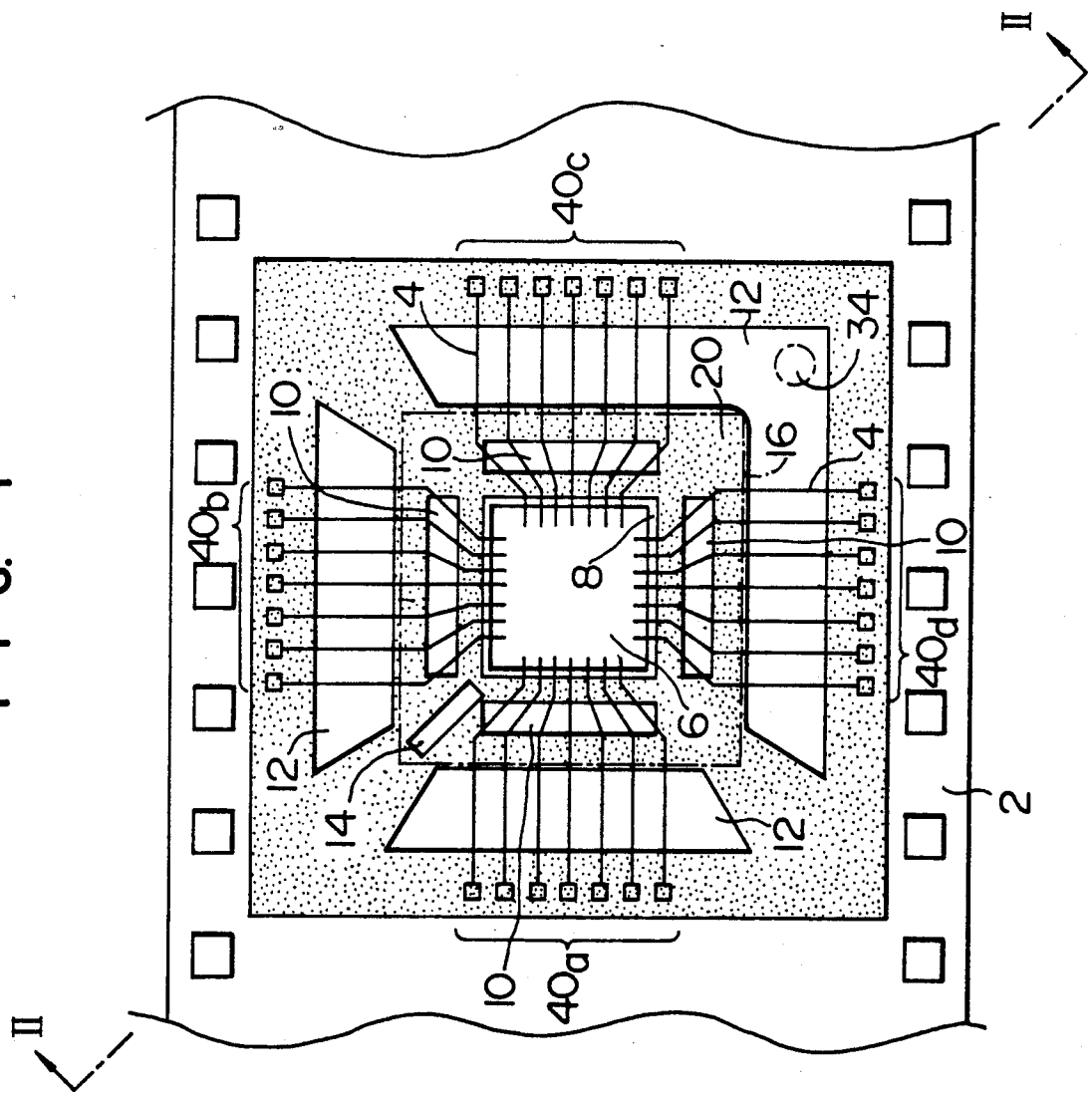
FIG. 1 is a schematic plan view of one frame of a tape carrier according to an embodiment of the present invention.

FIG. 1 shows one square frame of a tape carrier or film tape 2 according to an embodiment of the present invention. The tape carrier is made of a resin material such as polyimide which is excellent in heat resistance and elasticity. As shown, each frame of the film tape 2 has at its central portion a square opening 8 which defines the position of an integrated circuit chip 6 to be connected to the frame. Four lead groups 40a, 40b, 40c and 40d are provided for connecting or bonding pads of the integrated circuit chip 6 disposed in the opening 8 to pads of a printed circuit board (not shown) corresponding thereto. Many leads in each lead group extend substantially perpendicularly to one side of the opening 8. One end of each lead is positioned at a point inside the opening 8, that is, a point corresponding to one of the pads of the integrated circuit chip 6 to which that lead is to be bonded. The other end of each lead is positioned adjacent to the corresponding side of the square frame. A square area enclosed by a one-dotted chain line 16 is a mold area 20 where the integrated circuit chip 6 is molded with a resin after the leads have been bonded to the pads of the integrated circuit chip. In the area 20, four openings 10 are formed along the respective sides of the opening 8 and one opening 14 is formed between the lead groups 40a and 40b. Three openings 12 are provided outside the area 20.

The openings 10 are formed in the resin mold area 20. Accordingly, when resin molding is conducted, the resin can move between the cavity of an upper die member and the cavity of a lower die member through the openings 10. However, as the number of leads is increased recently more and more, the gaps between leads become smaller, which allows only a small amount of resin to actually move through the openings 10.

The openings 12 are formed outside the resin mold area 20. Accordingly, these openings are irrelevant to the movement of resin at the resin-molding process. The integrated circuit chip 6 as molded by resin is cut off from the film tape approximately along the outer lines is the openings 12.

The opening 14 is formed between the lead group 40a and the lead group 40b in the resin mold area 20. Accordingly, when the resin molding is conducted, the resin is allowed to move freely through the opening 14.

In the process of mounting the integrated circuit chip 6 on the film tape 2, leads 4 are firstly formed by Sn- or Au-plated Cu films on the film tape 2 having, for example, a width of 18.4 mm and a thickness of 1.9 mm. Next, the leads 4 and bumps, which are formed on Al pads of the integrated circuit chip by means of Au-plating or the like at the stage of a wafer, are bonded together by use of an Au-Sn eutectic method or an Au-Au thermocompression bonding method. In this state, the condition of bonding can be tested, if desired.

Figure 2:
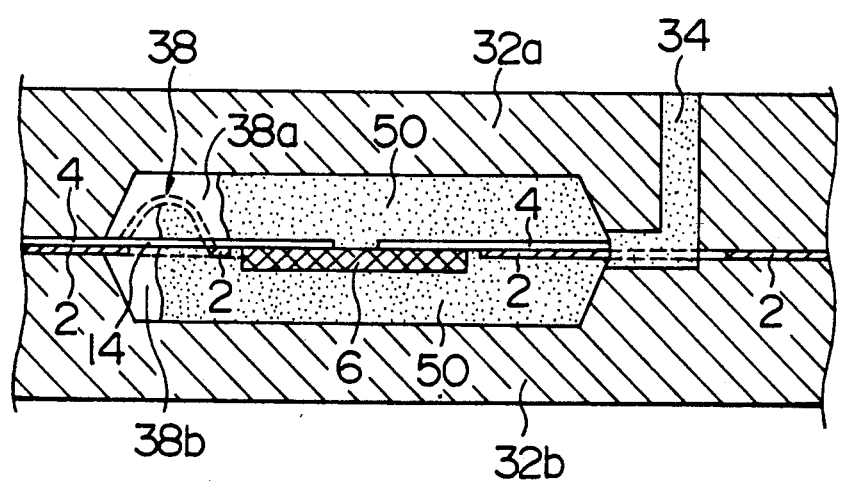
FIG. 2 is a cross section which is taken along line II—II in FIG. 1 and illustrates how an integrated circuit chip connected to the frame of the tape carrier shown in FIG. 1 is resin-molded.

When the integrated circuit chip 6 is resin-molded, a transfer molding method is usually employed. Namely, as shown in FIG. 2, the film tape 2 is sandwiched between the upper and lower die members 32a and 32b of a resin molding die and a resin is injected by pressure from a resin supply pot 34 provided in the die. The injected resin enters by pressure into a cavity 38 from an injection gate 36. The cavity 38 corresponds to the area 20 enclosed by the one-dotted chain line 16 in FIG. 1.

The integrated circuit chip 6 is thus mounted on the film tape 2. When the integrated circuit chip is ultimately assembled or packaged, the integrated circuit chip 6 is cut off from the film tape 2 and then mounted and solder-bonded to a printed board or ceramic substrate.

Since the top and bottom surfaces of the film tape 2 have different coefficients of friction and many leads 4 are formed on the upper surface of the film tape 2, while only an integrated circuit chip 6 having a flat surface is provided to the lower surface of the film tape 2, the flow rate of resin entering the cavity 38a of the upper die member 32a is slower than the flow rate of resin entering the cavity 38b of the lower die member 32b. As a result, the amounts of resin entering the cavities 38a and 38b are different from each other. Accordingly, the conventional film tape involves a problem that closed spaces having different volumes may be formed at the innermost corner portions of the upper and lower cavities 38a and 38b (remotest from the pot 34) at the final stage of the resin injection process so that the resin in the lower die member 32b urges the film tape 2 upward into the closed space of the upper die member 32a, as shown by broken lines in FIG. 2, resulting in unsatisfactory quality of resin molding.

In the case of the film tape 2 according to the present embodiment, however, the above problem can be avoided since the opening 14 is provided. Namely, though at the initial stage of the resin injection process the amounts of resin entering the cavities 38a and 38b are different as in the case of the conventional film tape, the resin 50 once entered the cavity 38b of the lower die member 32b flows into the cavity 38a of the upper die member 32a through the opening 14 at the final stage of the resin injection process, as shown in FIG. 2. Therefore, it is possible to obtain a balance in amount of injected resin between the cavities 38a and 38b of the upper and lower die members 32a and 32b. Accordingly, when the film tape 2 according to the present embodiment is used, the film tape 2 is prevented from being bent toward one side by the injected resin 50 at the resin molding process. It should be noted that the opening 14 is located in the cavity 38 at a position between the lead groups 4a and 4b in the mold area 20 which is remotest from the injection gate 36 so that the injected resin reaches the position lastly. If the flow rates of resin into the upper and lower die cavities are different from each other, the film tape would be urged to bend up- or down-ward at the position. Therefore, it is most effective to form the opening 14 at the position.

Figure 3:
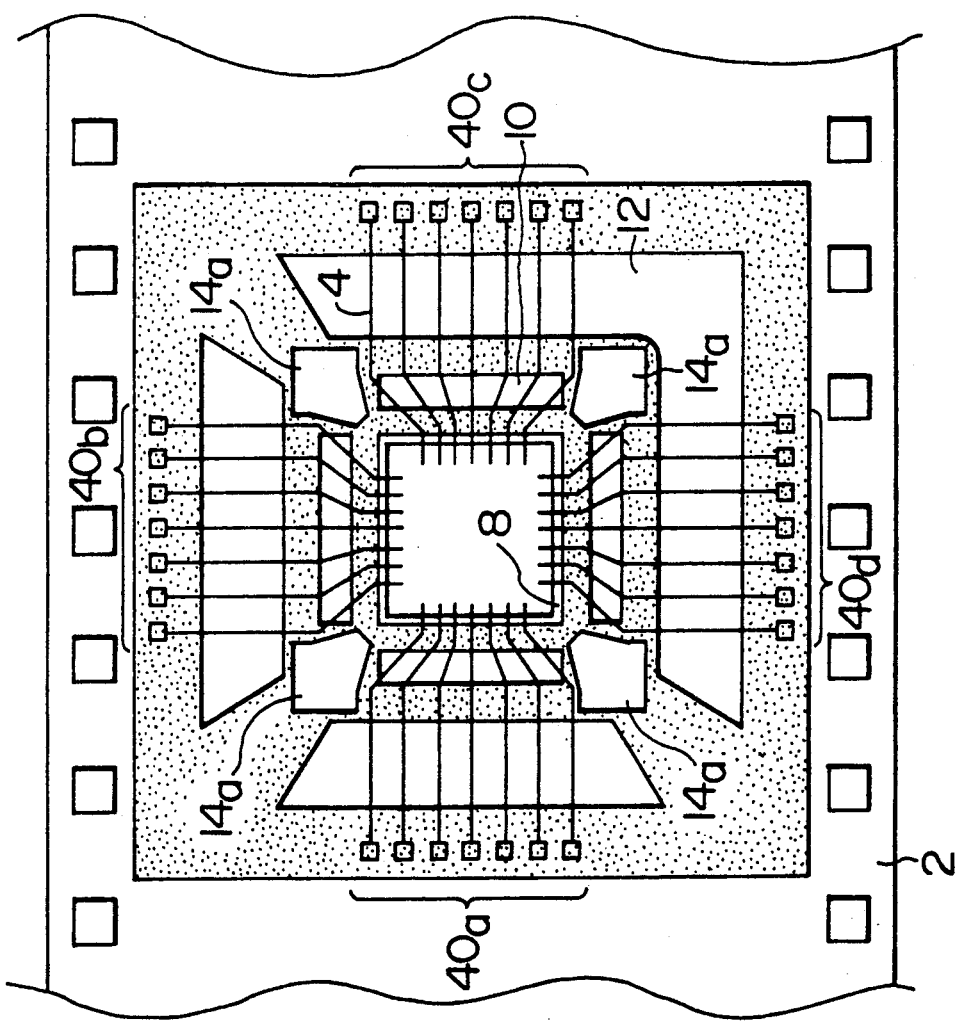
FIG. 3 is a schematic plan view of one frame of a tape carrier according to another embodiment of the present invention.

In another embodiment of the present invention shown in FIG. 3, openings 14a are provided at all of the corners of a square resin mold area 20 and each opening 14a is configured so as to provide a size as large as possible. With such a construction, since the flow rates of resin into the upper and lower die cavities are substantially balanced not only at the final stage of the resin injection process, but also at the initial stage thereof, it is possible to further improve the quality of resin-molded chips.

In the foregoing embodiments, one or four openings are formed at one corner or four corners of the square area 20. However, two or three openings may be formed at two or three corners, respectively. Further, the opening may be any form other than the shape shown in FIGS. 1 or 3. In general, however, the provision of a plurality of openings 14a having a large size possible, as shown in FIG. 3, is preferable since the provision of openings is aimed at allowing the resin to move freely from one to the other of the cavities of the upper and lower die members at the resin molding process.

As have been explained in the above, according to the present invention, since at least one opening is provided at a position where no lead is present, there can be provided a tape carrier which makes it possible to obtain a balance between the flow rate of resin into the resin fill cavity of the upper die member and that of the lower die member at the resin molding process, thereby improving the quality of resin molded chips.

We claim:

1. A tape carrier used for assemblage of integrated circuit chips based on a TAB system, comprising a plurality of square frames, each of said square frames comprising:

A substantially square opening for defining a position of an integrated circuit chip to be bonded to the frame, said square opening being formed within a mold area of the frame on which, when the integrated circuit chip mounted at the square opening and bonded to the frame is resin-molded, the resin-molded integrated circuit chip extends;

first opening means including at least two substantially rectangular first openings formed within said mold area at a space between said square opening and an outer periphery of said mold area;

a plurality of lead groups, each group including leads extending from an inside of said square opening to positions adjacent to a periphery of the frame by crossing one of said first openings; and second opening means including at least one second opening formed at a space between adjacent two said first openings, such that none of said leads extend across said second opening, for allowing a resin to flow therethrough in a process of resin-molding the integrated circuit chip mounted at the square opening.

2. A tape carrier according to claim 1, wherein said mold area is a square area and said at least one second opening is provided at one corner of said square area.

3. A tape carrier according to claim 1, wherein said second opening means includes a plurality of the second openings.

4. A tape carrier according to claim 1, wherein said mold area is a square area and said second opening means includes a plurality of the second openings provided respectively at the corners of said square area.

* * * * *